United States Patent
Darabi

(10) Patent No.: US 7,076,232 B2
(45) Date of Patent: Jul. 11, 2006

(54) METHOD AND APPARATUS FOR DC OFFSET CANCELLATION

(75) Inventor: Hooman Darabi, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 462 days.

(21) Appl. No.: 10/138,678

(22) Filed: May 3, 2002

(65) Prior Publication Data

US 2003/0181188 A1    Sep. 25, 2003

Related U.S. Application Data

(60) Provisional application No. 60/367,904, filed on Mar. 25, 2002.

(51) Int. Cl.
*H04Q 7/20*    (2006.01)
(52) U.S. Cl. .................. 455/324; 455/340; 455/341
(58) Field of Classification Search ............... 455/209, 455/208, 343.1, 2, 343.3, 4, 326, 313, 318, 455/323, 324, 325, 334, 337, 340, 344; 330/259, 330/85, 141; 327/307
See application file for complete search history.

(56) References Cited

U.S. PATENT DOCUMENTS

| | | | | |
|---|---|---|---|---|
| 4,820,973 A | * | 4/1989 | Alvarez | .................... 73/304 C |
| 5,471,665 A | * | 11/1995 | Pace et al. | ............... 455/343.2 |
| 6,104,173 A | * | 8/2000 | Kojima | ....................... 323/222 |
| 6,137,347 A | * | 10/2000 | Gonzalez | ..................... 327/538 |
| 6,483,349 B1 | * | 11/2002 | Sakata et al. | ................. 326/83 |
| 6,720,799 B1 | * | 4/2004 | Gupta | ......................... 327/92 |
| 2002/0041206 A1 | * | 4/2002 | Ueno et al. | ................... 330/85 |
| 2002/0115420 A1 | * | 8/2002 | Cheng | ........................ 455/333 |
| 2002/0173288 A1 | * | 11/2002 | Shu | ............................ 455/326 |
| 2003/0139153 A1 | * | 7/2003 | McMorrow et al. | ........ 455/108 |

* cited by examiner

*Primary Examiner*—Nguyen T. Vo
*Assistant Examiner*—Nhan T Le
(74) *Attorney, Agent, or Firm*—Garlick Harrison & Markison; James A. Harrison

(57) ABSTRACT

A radio transceiver includes amplification circuitry that is coupled to receive a down converted signal and to provide infinite rejection of any DC component added by the down conversion circuitry. Specifically, an amplification stage includes a voltage integrator that is coupled within a feedback loop of the amplification circuitry to produce a DC charge having a magnitude that equals the added DC component but a polarity that is opposite. Accordingly, the voltage produced by the voltage integrator is added to the signal received from the down conversion circuitry to cause the amplification circuitry to merely amplify the wireless communication signals characterized by a frequency of oscillation. Logic circuitry is used for selectively coupling the voltage integrator to an output port of the amplification circuitry.

16 Claims, 7 Drawing Sheets

METHOD AND APPARATUS FOR DC OFFSET CANCELLATION

CROSS-REFERENCE TO RELATED APPLICATION

This application claims priority to and incorporates by reference U.S. Provisional Application entitled, "Method and Apparatus for a Radio Transceiver" (Attorney Docket No. BP 2121P), having a serial No. of 60/367,904 and a filing date of Mar. 25, 2002.

BACKGROUND

1. Field of the Invention

This invention relates generally to wireless communications and, more particularly, to the operation of a Radio Frequency (RF) transceiver within a component of a wireless communication system.

2. Description of the Related Art

The structure and operation of wireless communication systems are generally known. Examples of such wireless communication systems include cellular systems and wireless local area networks, among others. Equipment that is deployed in these communication systems is typically built to support standardized operations, i.e., operating standards. These operating standards prescribe particular carrier frequencies, modulation types, baud rates, physical layer frame structures, MAC layer operations, link layer operations, etc. By complying with these operating standards, equipment interoperability is achieved.

In a cellular system, a regulatory body typically licenses a frequency spectrum for a corresponding geographic area (service area) that is used by a licensed system operator to provide wireless service within the service area. Based upon the licensed spectrum and the operating standards employed for the service area, the system operator deploys a plurality of carrier frequencies (channels) within the frequency spectrum that support the subscribers' subscriber units within the service area. Typically, these channels are equally spaced across the licensed spectrum. The separation between adjacent carriers is defined by the operating standards and is selected to maximize the capacity supported within the licensed spectrum without excessive interference. In most cases, severe limitations are placed upon the amount of adjacent channel interference that maybe caused by transmissions on a particular channel.

In cellular systems, a plurality of base stations is distributed across the service area. Each base station services wireless communications within a respective cell. Each cell may be further subdivided into a plurality of sectors. In many cellular systems, e.g., Global System for Mobile Communications (GSM) cellular systems, each base station supports forward link communications (from the base station to subscriber units) on a first set of carrier frequencies, and reverse link communications (from subscriber units to the base station) on a second set of carrier frequencies. The first set and second set of carrier frequencies supported by the base station are a subset of all of the carriers within the licensed frequency spectrum. In most, if not all, cellular systems, carrier frequencies are reused so that interference between base stations using the same carrier frequencies is minimized and system capacity is increased. Typically, base stations using the same carrier frequencies are geographically separated so that minimal interference results.

Both base stations and subscriber units include RF transceivers. Radio frequency transceivers service the wireless links between the base stations and subscriber units. The RF transmitter receives a baseband signal from a baseband processor, converts the baseband signal to an RF signal, and couples the RF signal to an antenna for transmission. In most RF transmitters, because of well-known limitations, the baseband signal is first converted to an Intermediate Frequency (IF) signal and then the IF signal is converted to the RF signal. Similarly, the RF receiver receives an RF signal, down converts the RF signal to an IF signal and then converts the IF signal to a baseband signal. In other systems, the received RF signal is converted directly to a baseband signal.

The RF receiver receives an RF signal, converts the RF signal to an IF signal, and then converts the IF signal to a baseband signal, which it then provides to the baseband processor. Similarly, received RF is down converted to an IF then to baseband. In other systems, the received RF is converted directly to baseband. In either case, however, a Direct Current (DC) component is often introduced to the down converted signal.

In the initial signal processing stages of an RF receiver, the received RF signal is converted to baseband through one or more steps. Initially, the received RF is mixed with a local oscillator (LO) to down convert the carrier frequency of the RF signal to a baseband frequency. It is common to utilize a high pass filter to remove a DC offset that is introduced during the frequency conversion processes. One problem with using a high pass filter to remove a DC offset, however, is that a high pass filter will provide good rejection of DC offset signals and signals having very low frequencies, but the rejection is not infinite, meaning it is not perfect.

There is a need in the art, therefore, for a low power RF receiver that provides improved low frequency rejection and DC offset cancellation. The failure to provide infinite rejection of low frequency signals and elimination of the DC offset may result in the amplification of the low frequency signals or DC offset thereby saturating the amplifier of the receiver system.

SUMMARY OF THE INVENTION

A radio transceiver includes amplification circuitry that is coupled to receive a down converted signal and to provide infinite rejection of any DC component added by the down conversion circuitry. Specifically, an amplification stage includes a voltage integrator that is coupled within a feedback loop of the amplification circuitry to produce a charge having a magnitude that equals the added DC component, but with an opposite polarity. Accordingly, the charge produced by the voltage integrator is added to the signal received from the down conversion circuitry to cancel the DC component and to cause the amplification circuitry to merely amplify the wireless communication signals received at the LNA input coupled to an antenna.

The feedback loop within the voltage integrator is not optimally kept electrically present within the circuit during steady state operations. Accordingly, the invention further includes logic circuitry for selecting when an input connection to the voltage integrator is coupled to an output port of the amplification circuitry. More specifically, a Metal Oxide Semiconductor Field Effect Transistor (MOSFET) is coupled to act as a resistor whenever a bias signal is coupled to its' gate. When the bias voltage is removed from the gate, however, the MOSFET appears as an open circuit thereby decoupling the input stage of the voltage integrator from the output stage of the amplification circuitry.

The logic circuitry that selects when the MOSFET acts as an open and when it operates as a resistor generally includes logic to cause the MOSFET to operate as a resistor only for a short specified period of time. For example, in one embodiment of the invention, the logic circuitry applies a bias voltage to the gate of the MOSFET only for a period of time that is approximately equal to the settling time that is defined by specifications or standard requirements for the circuit or transceiver. For 802.11b, for example, the settling time is defined to be 10 microseconds. Accordingly, in one embodiment of the present invention, the logic circuitry applies a bias voltage to the gate of the MOSFET for a period that is approximately equal to 10 microseconds every time a transition event occurs. A transition event occurs every time a new packet is received after a period of inactivity and every time the transceiver transitions from a standby state, a sleep state or an off state to a state of receiving data packets.

The voltage integrator that is coupled to the feedback of the amplification circuitry comprises an operational amplifier with a capacitor coupled across its minus input and its output. The resistor (or, in this case, MOSFET) is also coupled to the input port of the operational amplifier and to the output port of the amplification circuitry. Other features and advantages of the present invention will become apparent from the following detailed description of the invention made with reference to the accompanying drawings.

BRIEF DESCRIPTION OF THE DRAWINGS

These and other features, aspects and advantages of the present invention will be more fully understood when considered with respect to the following detailed description, appended claims and accompanying drawings wherein:

DETAILED DESCRIPTION OF THE DRAWINGS

Figure 1A:
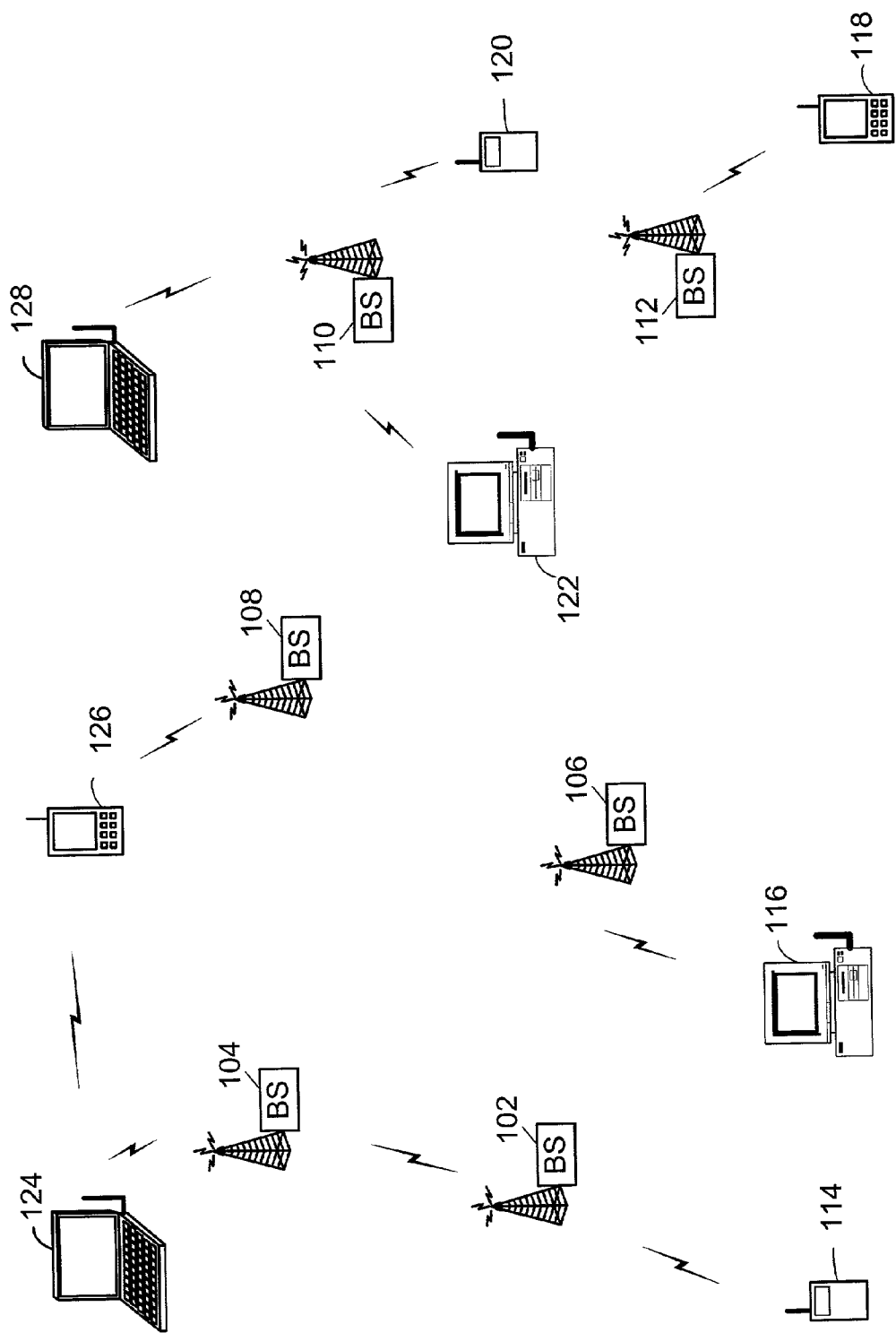
FIG. 1A is a system diagram illustrating a cellular system within which the present invention is deployed.

FIG. 1A is a system diagram illustrating a cellular system within which the present invention is deployed. The cellular system includes a plurality of base stations 102, 104, 106, 108, 110, and 112 that service wireless communications within respective cells, or sectors. The cellular system services wireless communications for a plurality of wireless subscriber units. These wireless subscriber units include wireless handsets 114, 118, 120, and 126, mobile computers 124 and 128, and desktop computers 116 and 122. During normal operations, each of these subscriber units communicates with one or more base stations during handoff among the base stations 102 through 112. Each of the subscriber units 114 through 128 and base stations 102 through 112 include RF circuitry constructed according to the present invention.

The RF circuitry formed according to the present invention may be formed to operate with any one of a number of different protocols and networks. For example, the network of FIG. 1A may be formed to be compatible with Bluetooth wireless technology that allows users to make effortless, wireless and instant connections between various communication devices such as notebook computers, desktop computers and mobile phones. Because Bluetooth systems use radio frequency transmissions to transfer both voice and data, the transmissions occur in real-time.

The Bluetooth specification provides for a sophisticated transmission mode that ensures protection from interference and provides security of the communication signals. According to most designs that implement the Bluetooth specifications, the Bluetooth radio is being built into a small microchip and is designed to operate in frequency bands that are globally available. This ensures communication compatibility on a worldwide basis. Additionally, the Bluetooth specification defines two power levels.

A first power level covers the shorter, personal area within a room and a second power level is designed for covering a medium range. For example, the second power level might be used to cover communications from one end of a building, such as a house, to the other. Software controls and identity coding are built into each microchip to ensure that only those units preset by the owners can communicate with each other. In general, it is advantageous to utilize low power transmissions and components that draw low amounts of power (especially for battery operated devices). The Bluetooth core protocols include Bluetooth-specific protocols that have been developed for Bluetooth systems. For example, the RFCOMM and TCS binary protocols have also been developed for Bluetooth but they are based on the ETSI TS 07.10 and the ITU-T recommendations Q.931 standards, respectively. Most Bluetooth devices require the Bluetooth core protocols, in addition to the Bluetooth radio, while the remaining protocols are only implemented when necessary.

The baseband and link control layers facilitate the physical operation of the Bluetooth transceiver and, more specifically, the physical RF link between Bluetooth units forming a network. As the Bluetooth standards provide for frequency-hopping in a spread spectrum environment in which packets are transmitted in continuously changing defined time slots on defined frequencies, the baseband and link control layer utilizes inquiry and paging procedures to synchronize the transmission of communication signals at the specified frequency and clock cycles between the various Bluetooth devices.

The Bluetooth core protocols further provide two different types of physical links with corresponding baseband packets. A synchronous connection-oriented (SCO) physical link and an asynchronous connectionless (ACL) physical link may be implemented in a multiplexed manner on the same RF link. ACL packets are used for data only while the SCO packets may contain audio, as well as a combination of audio and data. All audio and data packets can be provided with different levels of error correction and may also be encrypted if required. Special data types, including those for link management and control messages, are transmitted on a specified channel.

There are other protocols and types of networks being implemented and that may be used with the network of FIG. 1A. For example, wireless networks that comport with service premises-based Wireless Local Area Network (WLAN) communications, e.g., IEEE 802.11a and IEEE 802.11b communications, and ad-hoc peer-to-peer communications, e.g., Bluetooth (as described above). In a WLAN system, the structure would be similar to that shown in FIG. 1A, but, instead of base stations 102 through 112, the WLAN system would include a plurality of Wireless Access Points (WAPs). Each of these WAPs would service a corresponding area within the serviced premises and would wirelessly communicate with serviced wireless devices. For peer-to-peer communications, such as those serviced in Bluetooth applications, the RF transceiver of the present invention would support communications between peer devices, e.g., mobile computer 124 and wireless handset device 126. The fast growth of the mobile communications market and for networks as shown in FIG. 1A require the development of multi-band RF transceivers that are small in size, low in cost, and have low power consumption. These RF transceivers should be suitable for a high level of system integration on a single chip for reduced cost and miniaturized mobile device size. Low power consumption is very critical for increasing mobile device battery life, especially for mobile devices that include small batteries.

Generally, Bluetooth facilitates the fabrication of a low-cost and low-power radio chip that includes some of these protocols described herein. The Bluetooth protocol operates in the unlicensed 2.4 GHz Industrial Scientific Medical (ISM) band and, more specifically, transmits and receives on 79 different hop frequencies at a frequency in the approximate range of 2400 to 2480 MHz, switching between one hop frequency to another in a pseudo-random sequence. Bluetooth, in particular, uses Gaussian Frequency Shift Keying (GFSK) modulation. Its maximum data rate is approximately 721 kbits/s and the maximum range is up to 20–30 meters.

Even though Bluetooth has a much lower range and throughput than other known systems, its consequently significantly reduced power consumption means it has the ability to be much more ubiquitous. It can be placed in printers, keyboards, and other peripheral devices, to replace short-range cables. It can also be placed in pagers, mobile phones, and temperature sensors to allow information download, monitoring and other devices equipped with a Bluetooth access point. Nonetheless, it is advantageous to improve the low power consumption of Bluetooth devices to improve battery life for portable applications.

Similarly, wireless LAN technologies (such as those formed to be compatible with IEEE 802.11b) are being designed to complement and/or replace the existing fixed-connection LANs. One reason for this is that the fixed connection LANs cannot always be implemented easily. For example, installing wire in historic buildings and old buildings with asbestos components makes the installation of LANs difficult. Moreover, the increasing mobility of the worker makes it difficult to implement hardwired systems. In response to these problems, the IEEE 802 Executive Committee established the 802.11 Working Group to create WLAN standards. The standards specify an operating frequency in the 2.4 GHz ISM band.

The first IEEE 802.11 WLAN standards provide for data rates of 1 and 2 Mbps. Subsequent standards have been designed to work with the existing 802.11 MAC layer (Medium Access Control), but at higher frequencies. IEEE 802.11a provides for a 5.2 GHz radio frequency while IEEE 802.11b provides for a 2.4 GHz radio frequency band (the same as Bluetooth). More specifically, the 802.11b protocol operates in the unlicensed 2.4 GHz ISM band. Data is transmitted on binary phase shift keying (BPSK) and quadrature phase shift keying (QPSK) constellations at 11 Msps. 802.11b data rates include 11 Mbits/s, 5.5, 2 and 1 Mbits/s, depending on distance, noise and other factors. The range can be up to 100 m, depending on environmental conditions.

Because of the high throughput capability of 802.11b devices, a number of applications are more likely to be developed using 802.11b for networks such as that shown in FIG. 1A. These technologies will allow the user to connect to wired LANs in airports, shops, hotels, homes, and businesses in networks even though the user is not located at home or work. Once connected the user can access the Internet, send and receive email and, more generally, enjoy access to the same applications the user would attempt on a wired LAN. This shows the success in using wireless LANs to augment or even replace wired LANs.

The RF circuitry of the present invention is designed to satisfy at least some of the above mentioned standard-based protocols and may be formed in any of the subscriber units 114 through 128, base stations 102 through 112 or in any other wireless device, whether operating in a cellular system or not. The RF circuitry of the present invention includes low power designs that utilize CMOS technology and that support the defined protocols in a more efficient manner. Thus, for example, the teachings of the present invention may be applied to wireless local area networks, two-way radios, satellite communication devices, or other devices that support wireless communications. One challenge, however, with CMOS design in integrated circuits is that they typically utilize voltage sources having low values (e.g., 3 volts) and are generally noisy. It is a challenge, therefore, to develop receive and transmission circuitry that have full functionality while meeting these lower power constraints and while providing good signal quality. The system of FIGS. 1A and 1B include the inventive circuitry for removing a DC component of a down converted signal that was added or introduced during signal processing for a received RF signal.

Figure 1B:
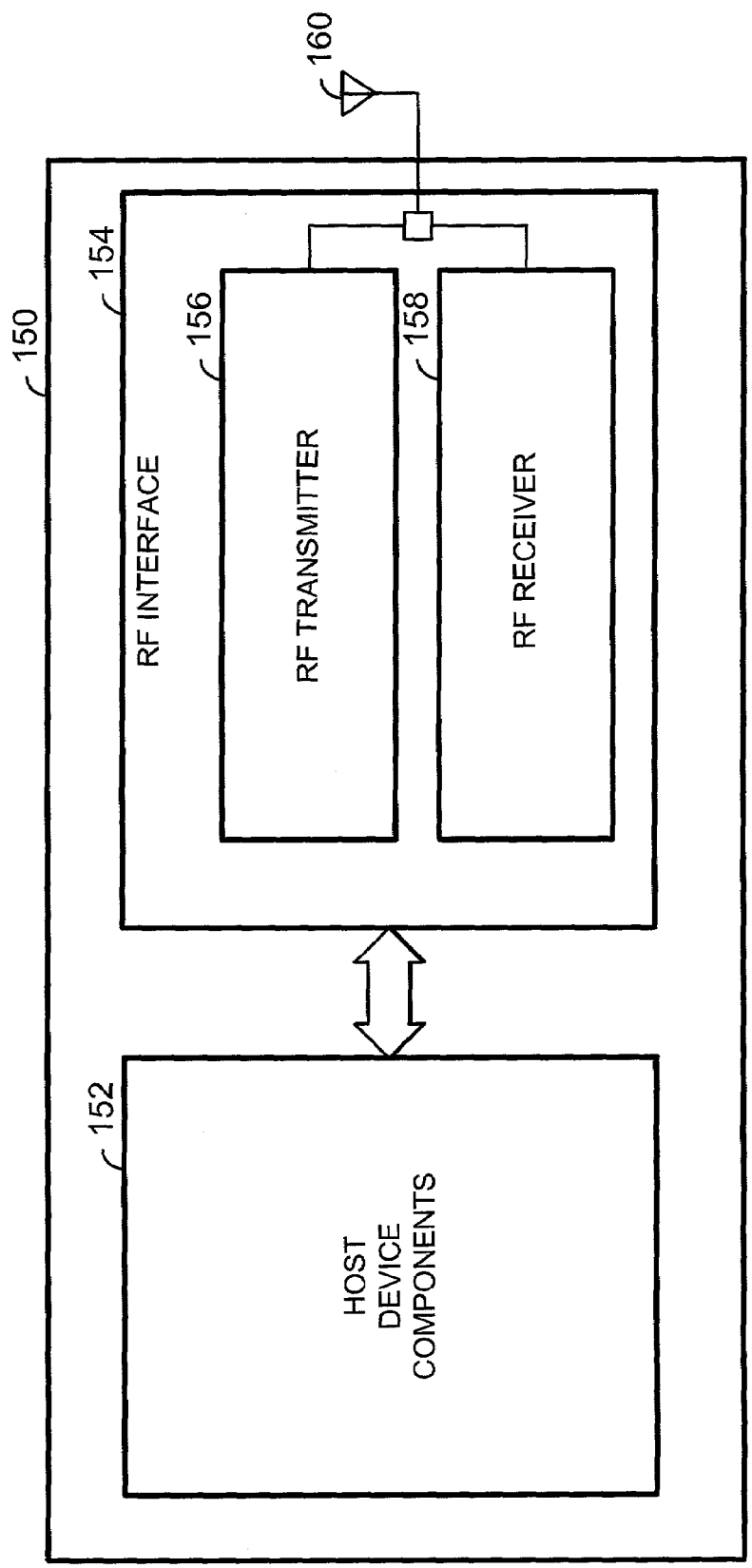
FIG. 1B is a block diagram generally illustrating the structure of a wireless device constructed according to the present invention.

FIG. 1B is a block diagram generally illustrating the structure of a wireless device 150 constructed according to the present invention. The general structure of wireless device 150 will be present in any of wireless devices 114 through 128 illustrated in FIG. 1A. Wireless device 150 includes a plurality of host device components 152 that service all requirements of wireless device 150 except for the RF requirements of wireless device 150. Of course, operations relating to the RF communications of wireless device 150 will be partially performed by host device components 152.

Coupled to host device components 152 is a Radio Frequency (RF) interface 154. RF interface 154 services the RF communications of wireless device 150 and includes an RF transmitter 156 and an RF receiver 158. RF transmitter 156 and RF receiver 158 both couple to an antenna 160. One particular structure of a wireless device is described with reference to FIG. 2. Further, the teachings of the present invention are embodied within RF transmitter 156 of RF interface 154.

The RF interface 154 may be constructed as a single integrated circuit. However, presently, the RF interface 158 includes an RF front end and a baseband processor. In the future, however, it is anticipated that many highly integrated circuits, e.g., processors, system on a chip, etc., will include an RF interface, such as the RF interface 154 illustrated in FIG. 1B. In such case, the receiver structure of the present invention described herein may be implemented in such devices. Thus, the receiver circuitry includes an amplifier configured as described herein to provide infinite rejection of a DC component added to a received RF or IF signal that has been down converted to a baseband frequency.

Figure 2:
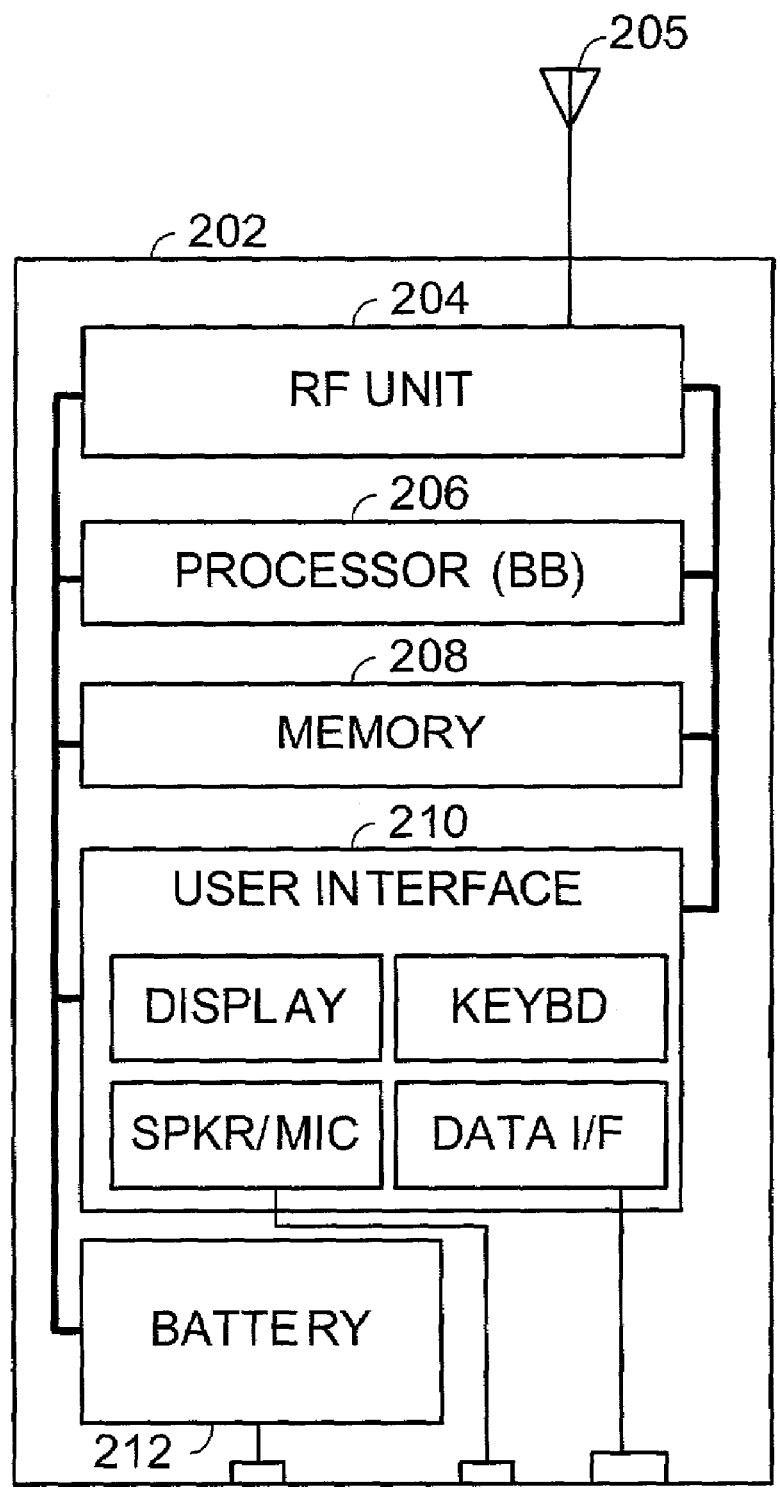
FIG. 2 is a block diagram illustrating a subscriber unit constructed according to the present invention.

FIG. 2 is a block diagram illustrating a subscriber unit 202 constructed according to the present invention. Subscriber unit 202 operates within a cellular system, such as the cellular system described with reference to FIG. 1A. Subscriber unit 202 includes an RF unit 204, a processor 206 that performs baseband processing and other processing operations, and a memory 208. RF unit 204 couples to an antenna 205 that may be located internal or external to the case of subscriber unit 202. Processor 206 may be an Application Specific Integrated Circuit (ASIC) or another type of processor that is capable of operating subscriber unit 202 according to the present invention. Memory 208 includes both static and dynamic components, e.g., Dynamic Random Access Memory (DRAM), Static Random Access Memory (SRAM), Read Only Memory (ROM), Electronically Erasable Programmable Read Only Memory (EEPROM), etc. In some embodiments, memory 208 may be partially or fully contained upon an ASIC that also includes processor 206. A user interface 210 includes a display, a keyboard, a speaker, a microphone, and a data interface, and may include other user interface components, as well. RF unit 204, processor 206, memory 208, and user interface 210 couple via one or more communication buses or links. A battery 212 is coupled to, and powers, RF unit 204, processor 206, memory 208, and user interface 210.

RF unit 204 includes the RF receiver components and operates according to the present invention to remove an added and undesirable DC component. More specifically, RF unit 204 includes the amplifier configuration that provides infinite rejection of DC signals added to a down converted signal. The structure of subscriber unit 202, as illustrated, is only one particular example of a subscriber unit structure. Many other varied subscriber unit structures could be operated according to the teachings of the present invention. Further, the principles of the present invention may be applied to base stations, as are generally described with reference to FIG. 1A.

Figure 3:
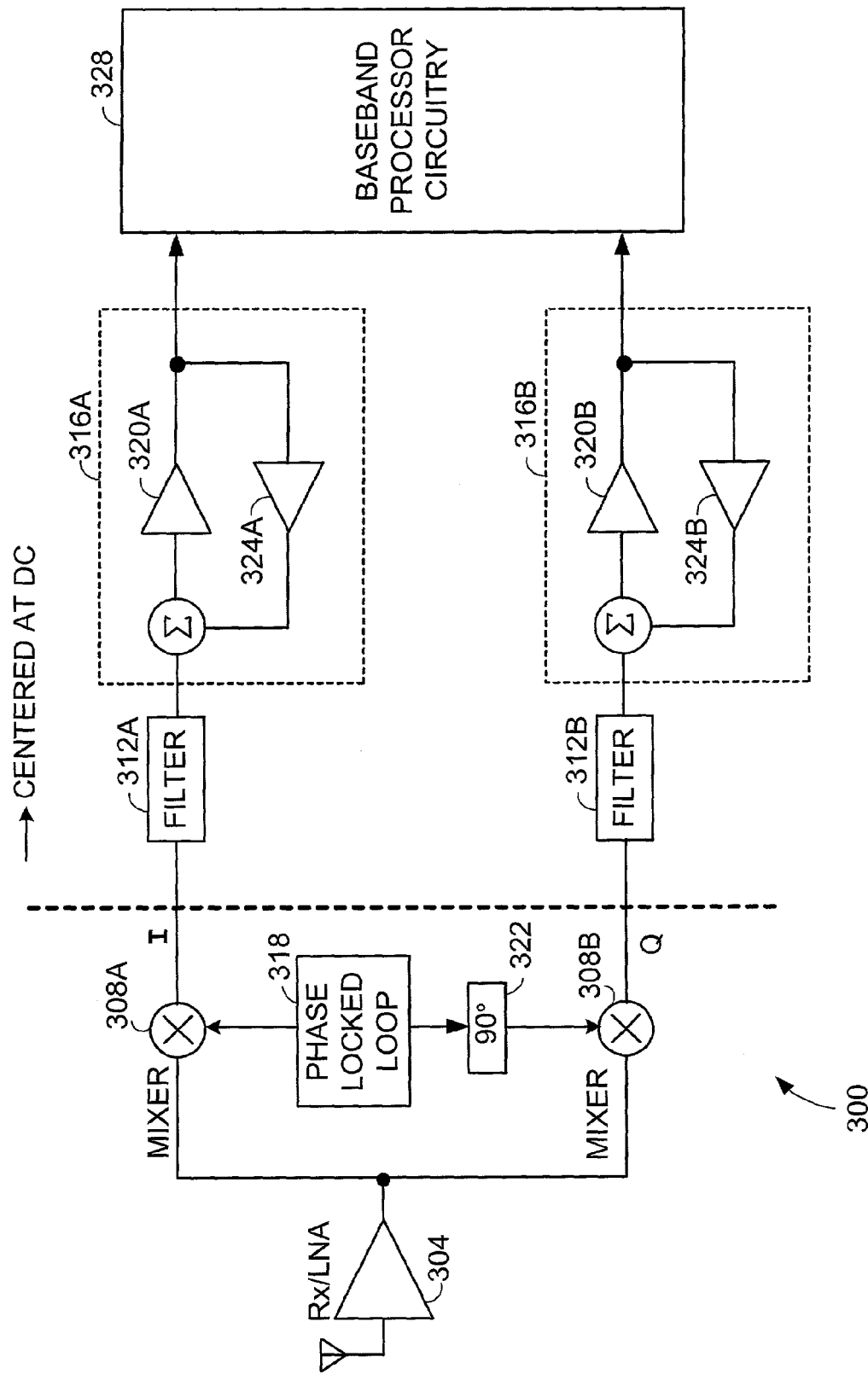
FIG. 3 is a functional schematic block diagram of an RF processing unit of a radio transceiver formed according to one embodiment of the present invention.

FIG. 3 is a functional schematic block diagram of a received portion of an RF processing unit of a radio transceiver formed according to one embodiment of the present invention. An RF receiver processing unit, shown generally at 300, initially receives a radio frequency signal, for example, a 2.4 GHz signal, at a receiver/low noise amplifier (receiver/LNA) 304 that it produces to a pair of mixers 308A and 308B, respectively. They are also coupled to receive a reference signal from a local oscillator for mixing with the signals produced by the receiver/LNA 304 to down convert the signals received from receiver/LNA 304 to a baseband frequency. The output of mixers 308A and 308B is a down converted signal whose carrier signal is converted from the received frequency to a baseband frequency that is approximately centered at DC (0 Hertz) in the frequency domain. More specifically, mixer 308A receives a reference signal directly from a local oscillator 318 and extracts the I component therefrom and down converts the I component to a baseband frequency. Mixer 308B receives the reference signal from a phase shifter 322 that introduces a ninety degree phase shift to the reference signal and, as such, extracts the Q component therefrom and down converts the Q component to a baseband frequency. Local oscillator 318 produces a reference signal and typically comprises a phase locked loop. Phase shifters such as phase shifter 322 are known by those of average skill in the art and merely produce a ninety degree phase shift to the reference signal output by the local oscillator 318.

The down converted signals are then produced from mixers 308A and 308B to a pair of low pass filters 312A and 312B, respectively. As is known, low pass filters 308A and 308B are for attenuating/blocking all signals above a specified corner frequency.

The signals that have not been attenuated by low pass filters 312 are then produced to an amplification stage prior to being transmitted to a baseband processor. More specifically, the filtered output from low pass filters 312A and 312B are produced to amplification circuitry 316A and 316B, respectively. Amplification circuitry 316A and 316B, each, further include variable gain amplifiers 320A and 320B, as well as high pass filters 324A and 324B in a feedback loop about variable gain amplifiers 320A and 320B. In the described embodiment of the present invention, voltage integrator circuits 324A and 324B comprise an integrator that, when configured properly, provides infinite rejection of DC signals. Thereafter, the amplified and filtered signal is produced from amplification circuitry 316A and 316B to a baseband processor circuitry 328.

Figure 4:
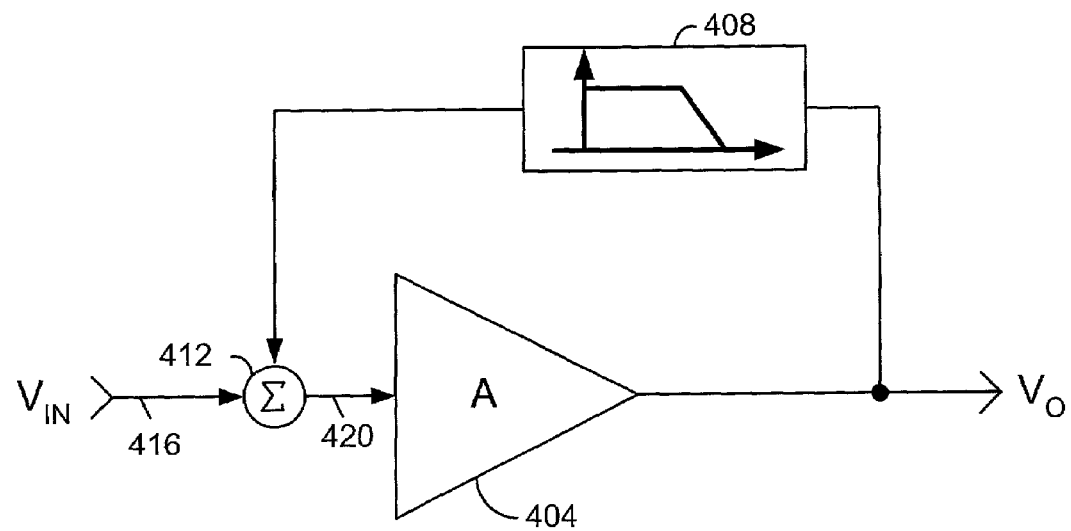
FIG. 4 is a functional schematic block diagram illustrating a method for removing a DC offset.

FIG. 4 is a functional schematic block diagram illustrating an amplifier for removing a DC offset in a radio receiver formed within an integrated circuit. As may be seen, an amplifier 404 produces an output to a low pass filter 408. The output of low pass filter 408 is then coupled to an adder 412 that mixes the output of low pass filter 408 with an input signal received by way of a line 416. The output of adder 412 is produced to the input of amplifier 404 by way of a line 420. Typically, low pass filter 408 comprises a capacitor and a resistor as is known by one of ordinary skill in the art. While the system of FIG. 4 provides for the removal of a DC offset, the rejection of the DC offset is not perfect or infinite. Thus, it is advantageous to have a circuit that provides maximal or infinite rejection of the DC offset signal.

Figure 5:
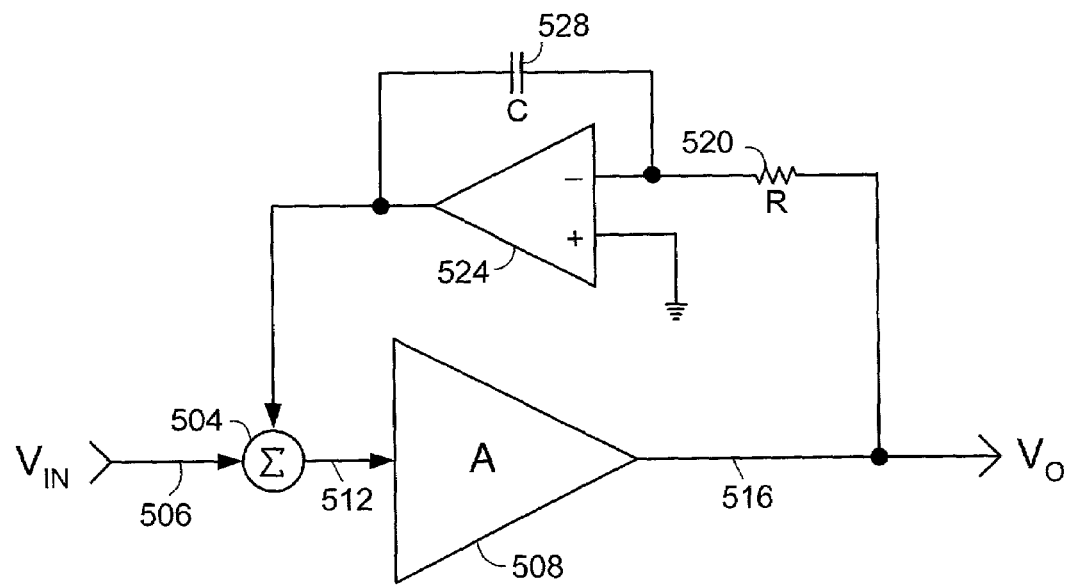
FIG. 5 is a functional schematic block diagram illustrating circuitry for rejecting or removing a DC offset signal formed according to one embodiment of the present invention.

FIG. 5 is a functional schematic block diagram illustrating circuitry for rejecting or removing a DC offset signal formed according to one embodiment of the present invention. An input signal is produced to an adder 504 by way of a line 506 that then produces a summed signal containing the original input signal to an amplifier 508 by way of a line 512. The output of amplifier 508 on a line 516 is generated to an input stage of an integrator. More specifically, a resistor 520 is coupled to receive the output of amplifier 508 and to provide the input signal to a negative input of an operational amplifier (Op Amp) 524. The input signal is also produced to a capacitor 528 that is coupled across the output of Op Amp 524 and the negative input of Op Amp 524. The output of Op Amp 524 further is coupled to adder 504 wherein the output is summed with the input signals received on line 506 and is then produced to amplifier 508 on line 512.

The present invention includes an integrator in a feedback loop of amplifier 508 for quickly charging a capacitor with the DC offset value. As will be explained in greater detail below, after capacitor 528 has been charged with the DC offset value, the integrator is electrically removed from the circuitry thereby facilitating normal operation of amplifier 508. However, because capacitor 528 has been charged with the DC offset signal, and that signal is subtracted from the input signal at adder 504, the DC offset in the input signal is effectively cancelled. While the integrator is charging to the DC component of a down converted signal, it also passes at least some of the alternating current (communications signal) back to the amplifier input. Accordingly, a two-part amplification process in which a first part comprises passing AC and charge from the integrator to the amplifier and a second part in which only a charge is passed to the input of the amplifier. The two-part amplification process transitions from the first part to the second part whenever the bias voltage is removed from the MOSFET on the integrator input thereby effectively opening the circuit and terminating the charging of the capacitor of the voltage integrator.

Figure 6:
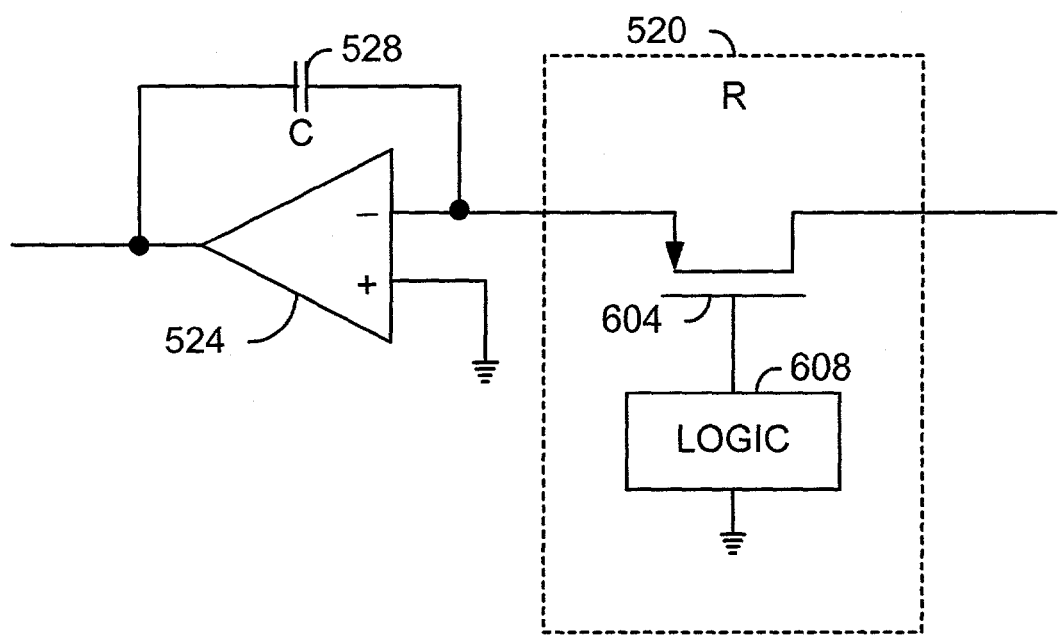
FIG. 6 is a functional schematic block diagram of the integrator circuitry that is for coupling in a feedback loop across a variable gain amplifier formed according to one embodiment of the present invention.

FIG. 6 is a functional schematic block diagram of integrator circuitry coupled in a feedback loop across an amplifier according to one embodiment of the present invention. Referring now to FIG. 6, Op Amp 524 and capacitor 528 described in relation to FIG. 5 may be seen here. Resistor 520 of FIG. 5, however, is replaced by the circuitry shown herein. More specifically, resistor 520 of FIG. 5 comprises a MOSFET 604 biased and coupled to act as a resistor in its linear mode of operation. Furthermore, logic circuitry 608 is coupled to provide a bias voltage to the gate of MOSFET 604 under specified conditions. As will be described in greater detail below, logic circuitry 608 produces a voltage to the gate of MOSFET 604 to reduce the resistance of the channel within the MOSFET only for a specified amount of time. Typically, the specified amount of time is one that is sufficiently long enough to allow capacitor 528 to charge up to the DC offset value, but short enough to allow the system to be electrically removed within any settling time requirements according to the requirements for the transceiver circuitry. For example, 802.11b provides for a 10 microsecond settling time. Accordingly, logic circuitry 608 will remove the voltage from the gate of MOSFET 604 within 10 microseconds after "power on" or the initial receipt of a packet. Logic circuitry 608 may comprise any known design approach for defining such operational logic. For example, the logic may readily be performed by a processor or by circuitry that defines a time constant in hardware. The logic circuitry 608 typically provides a voltage equal to VDD to turn the MOSFET 604 completely off (because MOSFET 604 is a p-channel enhancement MOSFET) after the settling time is achieved (approximately 10 microseconds) and as a consequence, open the DC offset loop during the receive mode. However, the logic block can be modified to produce a bias voltage to set the resistance of MOSFET 604 to some high value, rather than an open. By adjusting the bias voltage, the overall loop provides a high-pass behavior whose 3 dB bandwidth is a function of this bias, and is adjustable.

Figure 7:
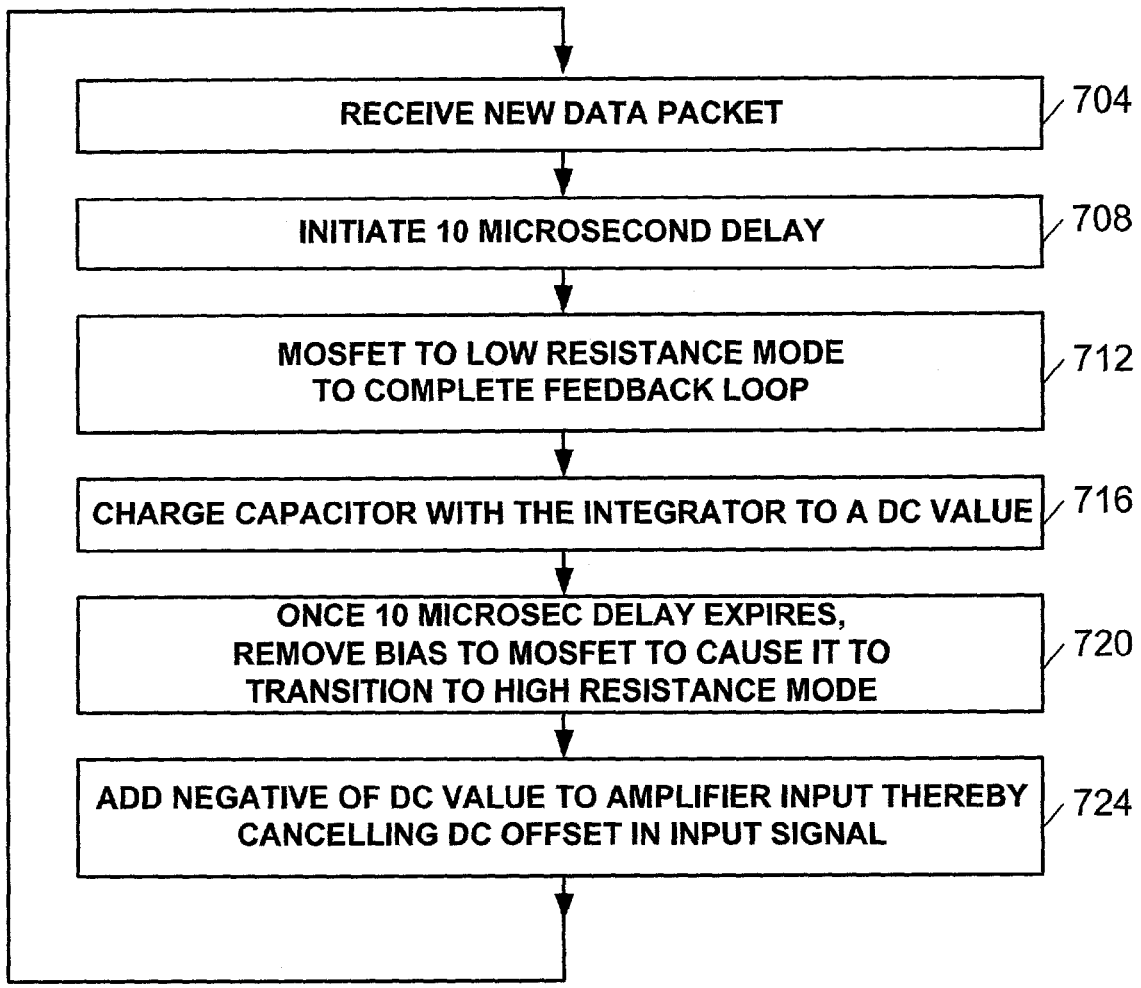
FIG. 7 is a flowchart that illustrates a method for removing a DC component from a signal that is to be amplified according to one embodiment of the present invention.

FIG. 7 is a flowchart that illustrates a method for removing a DC component from a signal that is to be amplified according to one embodiment of the present invention. Initially, an amplification circuit receives a new data packet (step 704). Thereafter, a 10 microsecond period is initiated during which a bias voltage is generated (step 708). While step 708 describes the generation of a bias voltage upon the receipt of a new data packet in step 704, other events may trigger the 10 microsecond generation of the biasing voltage. Generally, the 10 microsecond generation of the bias voltage occurs each time that the amplification circuitry transitions from a low power mode of operation to an operational state or mode of operation, meaning that signal processing and amplification is occurring.

Once the amplification circuitry generates the bias voltage for the 10 microsecond period, the bias voltage is applied to a MOSFET that is configured as a resistor to drive it to a low resistance value to complete a feedback loop (step 712). While the MOSFET is in a low resistance mode and the feedback loop is completed, a capacitor coupled across an input port and an output port of an integrator is charged to a DC value (step 716). Generally, while the feedback loop is present during which the MOSFET is coupled to a low resistance state, the capacitor charges to a DC value that equals the DC component of a received signal at the input port of the amplification circuitry. The 10 microsecond delay expires, thereby causing the amplification circuit to stop generating the bias voltage to the MOSFET. Accordingly, the MOSFET transitions to a high resistance mode to open the feedback loop (step 720). After the high resistance mode is achieved and the feedback loop is open, the DC value across the capacitor is provided to the amplification circuitry input, thereby canceling the DC offset (step 724).

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A receiver, comprising:
   an input port for receiving a RF wireless signal;
   down conversion circuitry coupled to receive the RF signal from the input port and producing a down converted baseband frequency signal;
   amplification circuitry coupled to receive the down converted baseband frequency signal and any DC signals introduced by the down conversion circuitry, the amplification circuitry for amplifying the received down converted baseband frequency signal; and
   a voltage integrator for charging a capacitor with a voltage that matches any DC signals introduced by the down conversion circuitry, the voltage integrator coupled to produce a charge having a DC voltage value that is opposite in polarity to the DC signals introduced by the down conversion circuitry to the input of the amplification circuitry;
   a MOSFET configured to operate as a resistor whenever a bias voltage is applied to a gate of the MOSFET, wherein the MOSFET is coupled between an input port of the voltage integrator and an output port of the amplification circuitry; and
   logic circuitry coupled to produce the bias voltage to the gate of the MOSFET to selectively charge the capacitor.

2. The receiver of claim 1 wherein the logic circuitry is coupled to receive an indication of a transition event wherein the transition event reflects that the transceiver device is changing to a normal mode of operation from one of an off state or standby mode of operation.

3. The receiver of claim 2 wherein the logic circuitry provides a bias voltage to the gate of the MOSFET for a period that is approximately equal to or less than a specified settling time for the transceiver device.

4. The receiver of claim 3 wherein the bias voltage for the gate of the MOSFET is produced to the gate for a period that is approximately equal to or less than 10 microseconds.

5. The receiver of claim 1 wherein the MOSFET is coupled to a negative input of the voltage integrator and wherein the MOSFET is a p-channel enhancement MOSFET and further wherein the MOSFET is turned off by applying a voltage approximately equal to VDD.

6. The receiver of claim 1 further including an adder for adding an output produced from the voltage integrator to the wireless signal received at the input port.

7. The receiver of claim 1 further including baseband processing circuitry for receiving an amplified output of the amplification circuitry and for processing the received amplified output from the amplification circuitry.

8. The receiver of claim 1 further comprising a mixer for producing a down converted baseband frequency signal including an I component.

9. The receiver of claim 8 further comprising a mixer for producing a down converted baseband frequency signal including a Q component.

10. The receiver of claim 9 wherein the amplification circuitry includes a voltage integrator coupled in a feedback loop of the amplification circuitry for removing any DC signals introduced by the down conversion circuitry.

11. The receiver of claim 10 wherein the voltage integrator serves to build up a DC charge and to pass high frequency signals in a first state of operation.

12. The receiver of claim 11 wherein the voltage integrator provides the built up DC charge only in a second state of operation to a negative terminal of the amplification circuitry.

13. A receiver, comprising:
   an input port for receiving a RF wireless signal;
   down conversion circuitry coupled to receive the RF signal from the input port and producing a down converted baseband frequency signal;
   amplification circuitry coupled to receive the down converted baseband frequency signal and any DC signals introduced by the down conversion circuitry, the amplification circuitry for amplifying the received down converted baseband frequency signal; and
   a voltage integrator for charging a capacitor with a voltage that matches any DC signals introduced by the down conversion circuitry, the voltage integrator coupled to produce a charge having a DC voltage value that is opposite in polarity to the DC signals introduced by the down conversion circuitry to the input of the amplification circuitry;
   a MOSFET configured to operate as a resistor whenever a bias voltage is applied to a gate of the MOSFET, wherein the MOSFET is coupled between an input port of the voltage integrator and an output port of the amplification circuitry; and
   wherein the MOSFET is coupled to a negative input of the voltage integrator and wherein the MOSFET is a p-channel enhancement MOSFET and further wherein the MOSFET is turned off by applying a voltage approximately equal to VDD.

14. The receiver of claim 13 wherein the logic circuitry is coupled to receive an indication of a transition event wherein the transition event reflects that the transceiver device is changing to a normal mode of operation from one of an off state or standby mode of operation.

15. The receiver of claim 14 wherein the logic circuitry provides a bias voltage to the gate of the MOSFET for a period that is approximately equal to or less than a specified settling time for the transceiver device.

16. The receiver of claim 15 wherein the bias voltage for the gate of the MOSFET is produced to the gate for a period that is approximately equal to or less than 10 microseconds.

* * * * *